United States Patent [19]

Flora et al.

[11] Patent Number: 4,754,164

[45] Date of Patent: Jun. 28, 1988

[54] METHOD FOR PROVIDING AUTOMATIC CLOCK DE-SKEWING ON A CIRCUIT BOARD

[75] Inventors: Laurence P. Flora, Covina; Michael A. McCullough, Pasadena, both of Calif.

[73] Assignee: Unisys Corp., Detroit, Mich.

[21] Appl. No.: 68,284

[22] Filed: Jun. 30, 1984

[51] Int. Cl.[4] .................... H03K 5/13; H03K 5/159
[52] U.S. Cl. .................................. 307/269; 307/602; 307/606; 307/591; 328/55
[58] Field of Search ............... 307/601, 602, 603, 606, 307/590, 591, 595, 597, 303; 328/55; 371/1

[56] References Cited

U.S. PATENT DOCUMENTS

| | | | |
|---|---|---|---|
| 4,047,132 | 9/1977 | Krajewski | 333/238 |
| 4,447,870 | 5/1984 | Tague et al. | 364/200 |
| 4,479,216 | 10/1984 | Krambeck et al. | 307/269 |
| 4,488,297 | 12/1984 | Vaid | 328/55 |
| 4,560,962 | 12/1985 | Barrow | 333/238 |
| 4,623,805 | 11/1986 | Flora et al. | 307/591 |
| 4,637,018 | 1/1987 | Flora et al. | 328/55 |

Primary Examiner—Stanley D. Miller
Assistant Examiner—Trong Quang Phan
Attorney, Agent, or Firm—Nathan Cass; Kevin R. Peterson; Edmund M. Chung

[57] ABSTRACT

A method of providing automatic clock de-skewing for integrated circuit chips carried by a multi-layer circuit board. In a preferred implementation of the method, a clock distribution chip includes on-chip automatic clock de-skewing circuitry requiring an accurate reference delay which is advantageously provided by a strip transmission line formed on one of the conductive planes of the multi-layer circuit board containing the chips.

11 Claims, 5 Drawing Sheets

MAIN CLOCK C

DELAYED CLOCK $C_d$

OUTPUT CLOCK $C_s$

MAIN CLOCK C

DELAYED CLOCK $C_d$

OUTPUT CLOCK $C_s$

MAIN CLOCK C

DELAYED CLOCK $C_d$

OUTPUT CLOCK $C_s$

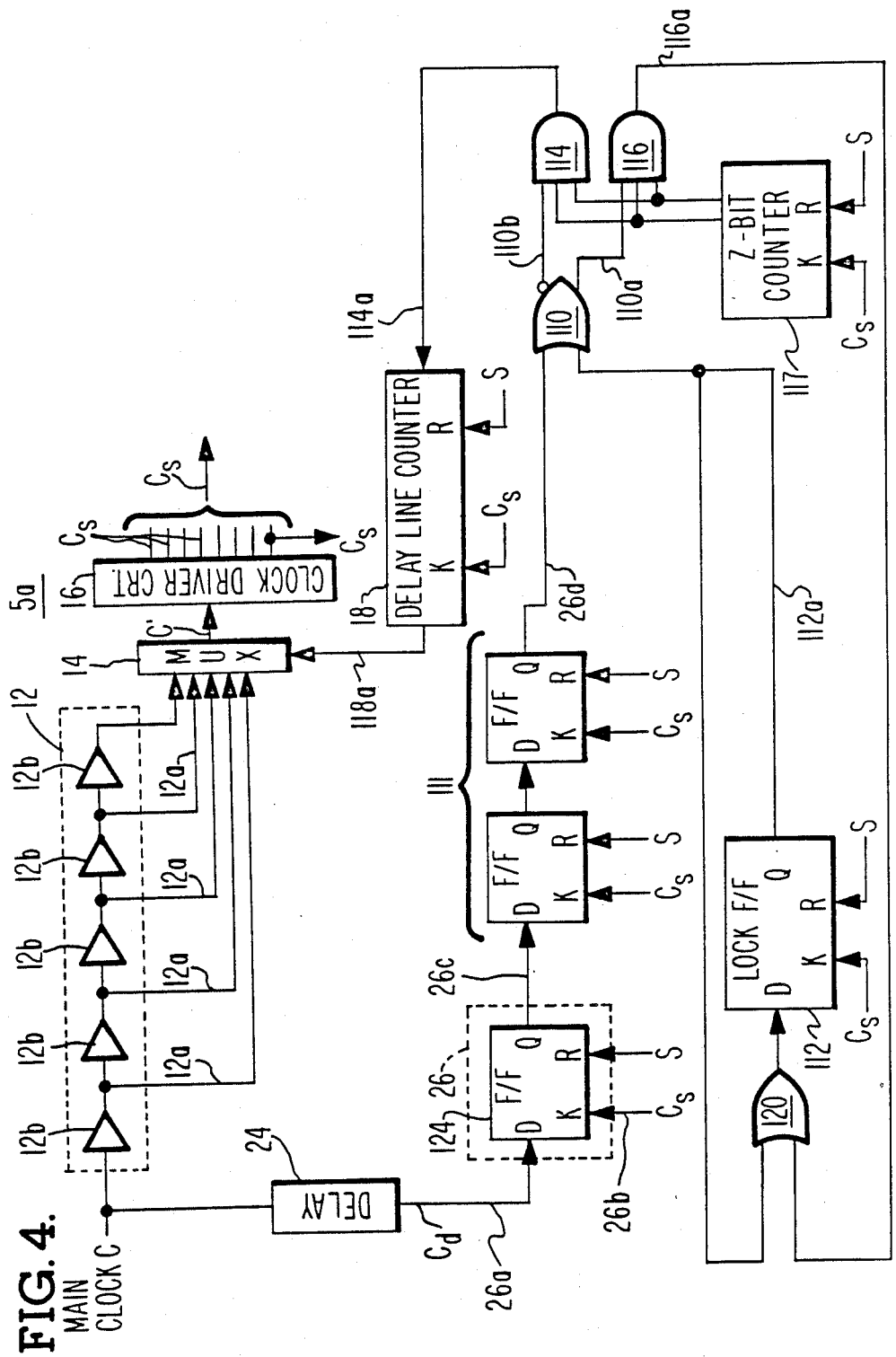

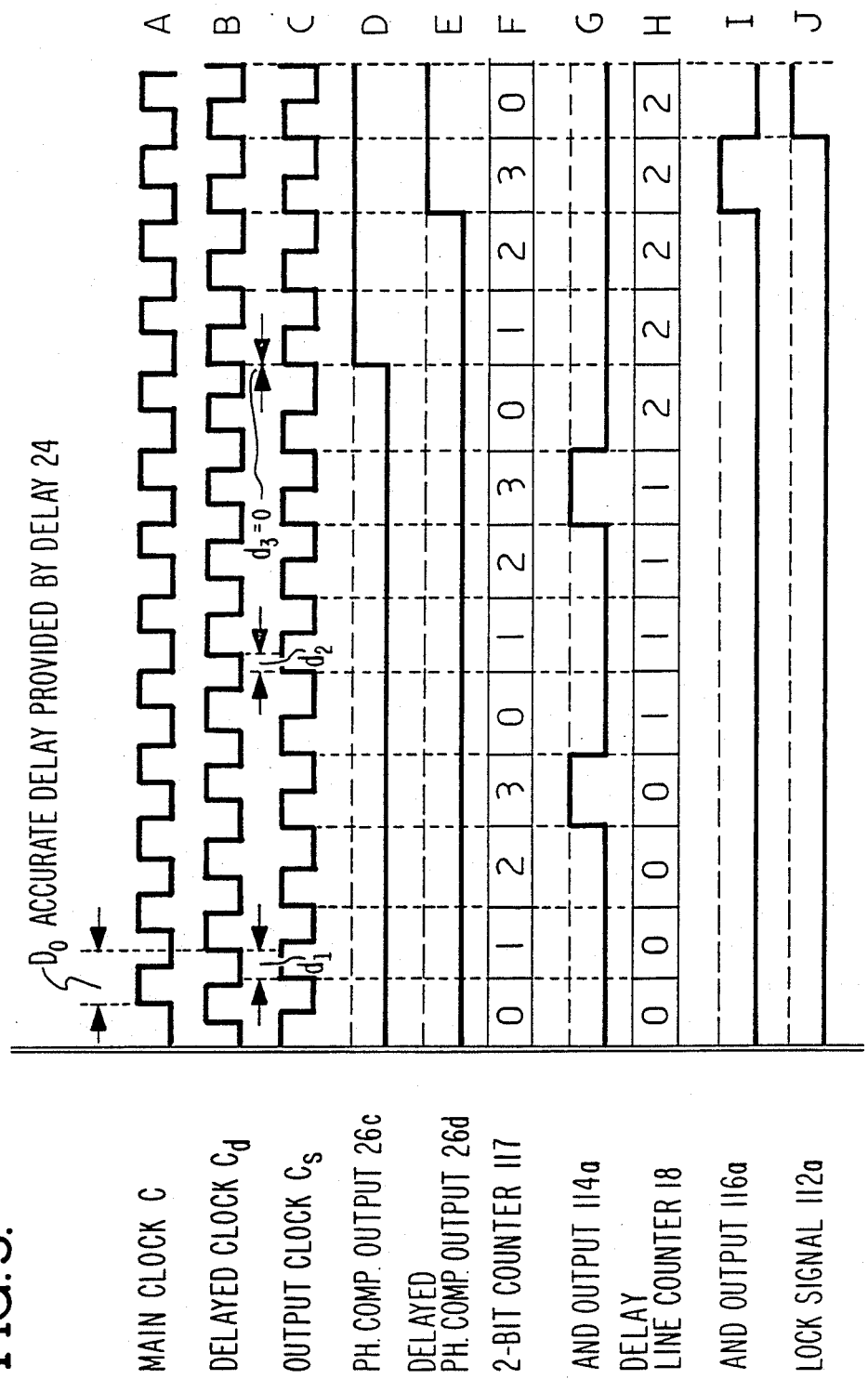

METHOD FOR PROVIDING AUTOMATIC CLOCK DE-SKEWING ON A CIRCUIT BOARD

CROSS REFERENCE TO RELATED PATENTS AND APPLICATION

This application contains subject matter related to our commonly assigned U.S. Pat. Nos. 4,637,018, issued Jan. 13, 1987, and 4,623,805, issued Nov. 18, 1986, and also to the concurrently filed U.S. patent application Ser. No. 068,285, filed 6/30/87, for Automatic Clock De-Skewing Apparatus.

BACKGROUND OF THE INVENTION

This invention relates generally to data processing systems and more particularly to improved means and methods for overcoming the deleterious effects of propagation time variations in a synchronous digital data processing system.

A particular problem which is caused by propagation time variations in a synchronous data processing system occurs in connection with the design of a clock distribution system. For example, propagation time variations can produce significant skewing of the clocks applied to different parts of the system. In order to prevent this skewing from creating timing problems, a conventional solution is to add the maximum skew to the minimum system cycle time so as to thereby guarantee that all data signals arrive at their destination storage elements (e.g., flip-flops) before the clock does. In today's high performance systems (either computers or other systems designed using digital devices), this increase in cycle time can have a significant deleterious effect on system speed.

A primary cause of skew in a data processing system is a result of propagation time variations which occur between integrated circuit chips due to manufacturing process tolerances. This is a particularly sensitive problem in the case of clock distribution circuitry, since inter-chip propagation time delays will produce skews in the clocks distributed throughout the system.

One solution to the skew problem is to improve chip fabrication processes to make chips more uniform so that tolerances from chip-to-chip are smaller. However, the increased cost that would be involved makes this solution economically impractical.

Another type of solution which has been employed to minimize skew is to provide for manual (or operator-controlled) adjustment of the clock distribution system, such as disclosed for example in U.S. Pat. No. 4,447,870 for "APPARATUS FOR SETTING THE BASIC CLOCK TIMING IN A DATA PROCESSING SYSTEM", issued May 8, 1984, S. A. Tague, et al., inventors. Besides the inconvenience of having to provide manual or operator-controlled adjustment, this solution is also expensive because of the increased labor and/or set-up which would be required. Furthermore, such initial skew adjustment cannot compensate for skew resulting from later occurring factors, such as temperature variations.

It is to be noted that clock skew can also present problems in connection with communication receiver circuitry where signals may be received at times which are not properly in phase with a system clock. Special synchronizing techniques have been developed for handling asynchronous received signals, such as disclosed, for example, in U.S. Pat. No. 3,908,084 for "HIGH FREQUENCY CHARACTER RECEIVER" issued Sept. 23, 1975, P. R. Wiley, inventor. However, because of the different factors involved, such techniques are not appropriate for solving the inter-chip propagation time variation problem to which the present invention is directed.

SUMMARY OF THE PRESENT INVENTION

A broad object of the present invention is to provide improved means and methods for reducing problems caused by propagation time differences in a data processing system.

A more specific object of the invention is to provide improved means and methods for significantly reducing inter-chip skew in a digital data processing system.

Another object of the invention is to provide improved means and methods for significantly reducing skew in the clocks provided by a clock distribution system.

Another object of the invention is to provide improved means and methods in accordance with one or more of the foregoing objects for significantly reducing skew in a relatively simple and economical manner without requiring hand or operator-controlled adjustment.

A particularly important object of the invention is to provide improved means and methods for implementing automatic clock skew adjustment in a data processing system comprised of a plurality of circuit boards or cards each containing a plurality of integrated circuits.

A further object of the invention in accordance with one or more of the foregoing objects is to provide improved means and methods for reducing skew which can be implemented with most known logic families.

A still further object of the invention in accordance with one or more of the foregoing objects is to provide means and methods for reducing skew which is particularly well suited for use in VLSI (very large scale integration) technology.

In a particular preferred embodiment of the invention, a data processing system is constructed and arranged such that each of a plurality of its circuit boards includes a clock distribution integrated circuit chip responsive to a main-system clock for providing clock signals for distribution to other circuitry provided on its respective board. Each clock distribution chip includes automatic clock de-skewing circuitry for automatically adjusting the propagation delay of the clock distribution chip so that the output clock signals provided to circuitry on its respective board have an accurate predetermined relationship relative to the main-system clock. The automatic de-skewing circuitry provided on each clock distribution chip employs an accurate, relative large reference delay element which is advantageously provided by a specially formed conductor incorporated in the board containing the clock distribution chip.

The specific nature of the invention as well as other objects, advantages, uses and features thereof will become evident from the following description in conjunction with the accompanying drawings.

BRIEF DESCRIPTION OF THE DRAWINGS

FIG. 4 is an electrical block diagram illustrating a more specific implementation of the clock distribution chip 5a illustrated in FIG. 2.

FIG. 5 comprises timing graphs illustrating operation of the implementation of FIG. 4 for a specific example of automatic clock delay adjustment in accordance with the invention.

DETAILED DESCRIPTION OF THE INVENTION

Like numerals and characters designate like elements throughout the drawings.

Figure 1:
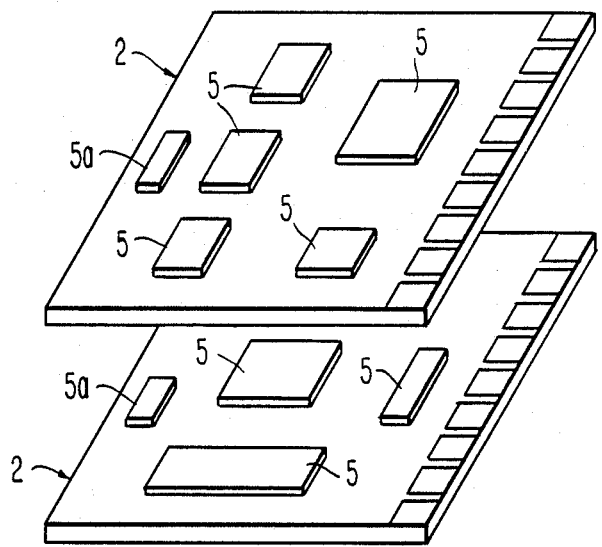
FIG. 1 is an electrical block diagram generally illustrating how clocking is provided for a plurality of circuit boards of a data processing system in a preferred embodiment of the invention.

Referring initially to FIG. 1, illustrated therein is a plurality of circuit boards 2 of a data processing system. Each circuit board 2 has a plurality of integrated circuit chips 5 and 5a mounted thereto and interconnected by electrical connections (not shown) in a conventional manner. The boards 2 are in turn interconnected in a conventional manner using other boards, backplanes or the like (also not shown).

The chip 5a on each board 2 is a clock distribution chip to which an input clock Ci is applied, each input clock Ci being derived from a main clock C. This clock distribution chip 5a is constructed and arranged to operate in response to the applied main clock C so as to provide output clocks which are distributed to appropriate ones of the other chips 5 on the board for providing clocking therefor.

In order to prevent clock skew, it is conventional to choose conductor lengths so that the resulting main clocks C applied to the clock distribution chips of the boards 2 are substantially in phase with one another. Also to prevent clock skew, it is conventional to provide for equal conductor lengths between the clock outputs of the clock distribution chip 5a and the clock inputs of the other chips 5 on the board so that the resulting clocks applied to each chip on the same board will be substantially in phase with one another. While these measures help to reduce clock skew, differences in the propagation times provided by the distribution chips 5a also have to be taken into account, since such differences can produce skew with respect to the outputs of different boards. A preferred manner for solving this problem is by the provision of automatic clock deskewing circuitry on each board 2 which will bring the outputs of all of the clock distribution chips 5a substantially into phase with one another despite propagation delay variations which typically occur in the clock driver circuits. A preferred manner for achieving this advantageous result is to incorporate automatic clock de-skewing circuitry on each clock distribution chip 5a.

Figure 2:
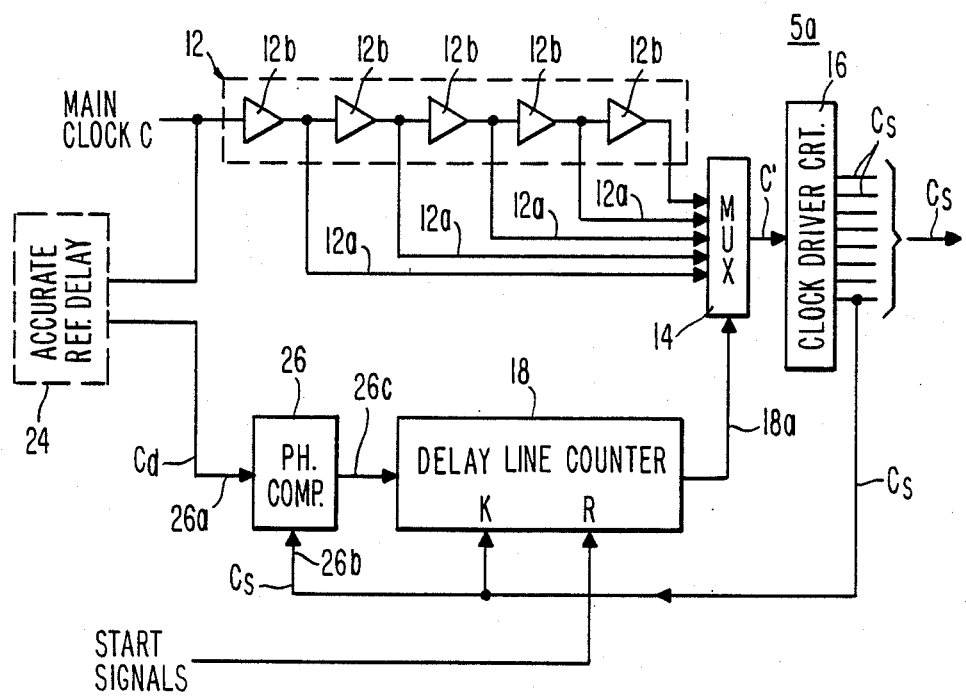
FIG. 2 is an electrical block diagram illustrating a preferred implementation of a clock distribution chip 5a in FIG. 1 in accordance with the invention.

FIG. 2 illustrates a particular preferred implementation of a clock distribution chip 5a in FIG. 1 incorporating circuitry for automatically adjusting the delay between an output clock $C_s$ and the applied main system clock C to a desired constant value. It is to be understood that all of the chips 5a shown in FIG. 1 are preferably implemented in a like manner.

The preferred implementation of the clock distribution chip 5a shown in FIG. 2 will now be considered in more detail. As shown, a main clock C is applied to a multi-tapped delay line 12 which provides a plurality of outputs 12a having successively larger delays relative to the main clock C depending upon their location along the multi-tapped delay line 12. As shown, the multi-tapped delay line 12 may, for example, comprise a string of gates 12b.

The delay line outputs 12a in FIG. 2 are applied to a multiplexor 14 which selects a particular one of the outputs 12a as determined by a count output 18a applied thereto from a delay line counter 18. The resulting selected clock C' appearing at the output of the multiplexor 14 is applied to conventional clock driver circuitry 16 for producing the output clock signals $C_s$ to be distributed to other chips 5 on the same board (FIG. 1).

It will be seen in FIG. 2 that, besides being applied to the multi-tapped delay line 12, the main clock C is also applied to an accurate fixed reference delay 24 (indicated by the dashed elongated block in FIG. 2) which produces a delayed clock signal $C_d$ having a delay $d_0$ relative to the main clock C. In accordance with the present invention, this accurate fixed delay 24 is provided off-chip by a specially formed conductor provided in each board, the construction and arrangement of which will be more specifically considered later on herein.

The resulting delayed clock signal $C_d$ provided by the reference delay 24 is applied to one input 26a of a phase comparator 26 while a representative output clock signal $C_s$ from the clock driver circuitry 16 is fed back to the other phase comparator input 26b. Basically, operation of the preferred clock distribution chip 5a in FIG. 2 is caused to be such that, each time the phase comparator 26 detects that the clock signals $C_d$ and $C_s$ have different delays relative to the main clock C (as illustrated for example by d in FIG. 3A), a count signal is caused to be produced at the phase comparator output 26c. This count signal causes the counter 18 to count (from an initial count set by a start signal S applied to the counter reset input R) until the count output 18a reaches a count such that the output 12a selected by the multiplexor 14 produces an output clock signal $C_s$ having substantially the same delay $d_0$ relative to the main clock C as the delayed clock $C_d$ (as illustrated for example in FIG. 3B), at which time the count signal is removed so that the then existing delay $d_0$ provided for $C_s$ relative to the main clock C remains constant.

Thus, the circuit of FIG. 2 will have automatically been adjusted to provide output clock signals $C_s$ having an accurate delay relative to the main clock C, as determined by the accurate delay 24. Since all of the clock distribution chips 5a in FIG. 1 can be designed in a like manner, the clock signals $C_s$ from all of the chips 5a of the clock distribution system can automatically be provided with substantially the same delay relative to the main clock C in this advantageous manner, which may be accomplished for example during power-on initialization.

A particular advantage of the preferred embodiment illustrated in FIG. 2 is that the provision of the accurate reference delay 24 permits the string of gates 12b used for the multi-tapped delay line 12 to be simply and economically implemented. Although the timing accuracy obtained using such a string of gates 12b is poor, there is no deleterious effect on circuit performance, since inaccuracies will automatically be tuned out by the feedback action which relies on the reference delay 24 for timing accuracy.

Referring next to FIG. 4, illustrated therein is a more specific preferred embodiment of a chip 5a in FIG. 1. Components which perform functions similar to those which have already been considered in connection with FIG. 2 have been given the same designations. Also, components in FIG. 4 which are not specifically shown in FIG. 2 have been given numbers greater than 100.

As in FIG. 2, the main clock C in FIG. 4 is applied to the multi-tapped delay line 12 whose outputs 12a are in turn applied to the multiplexor 14 which operates in response to the count output 18a provided by the counter 18 to select a particular one of these outputs 12a for application to the clock driver circuitry 14 for producing the output clock signals $C_s$.

Also as in FIG. 2, the main clock C in FIG. 4 is applied, via the accurate delay 24, to the phase comparator input 26a, while a representative output clock signal $C_s$ from the clock driver circuitry 16 is applied to the other phase comparator input 26b. FIG. 4 shows that this phase comparator 24 may typically comprise a flip-flop 124 wherein the flip-flop input D serves as the phase comparator input 26a to which the delayed clock signal $C_d$ is applied, wherein the flip-flop clock input K serves as the phase comparator input 26b to which the output clock signal $C_s$ is applied, and wherein the flip-flop output Q serves as the phase comparator output 26c. As will be noted in FIG. 4, the clock signal $C_s$ is used as the clock applied to the clock inputs K of the clocked components (such as counter 18 and flip-flop 124) while the start signal S (provided for example during power-up initialization) is applied to the reset inputs R of these components for resetting them to desired initial states.

Figure 3A:
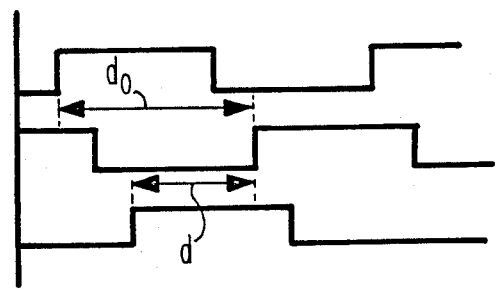
FIGS. 3A and 3B comprise timing groups illustrating the overall operation of the clock distribution chip 5a of FIG. 2.
Figure 3B:
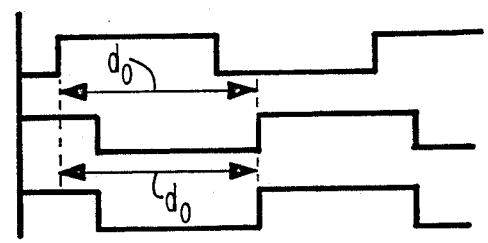
Figure 7:
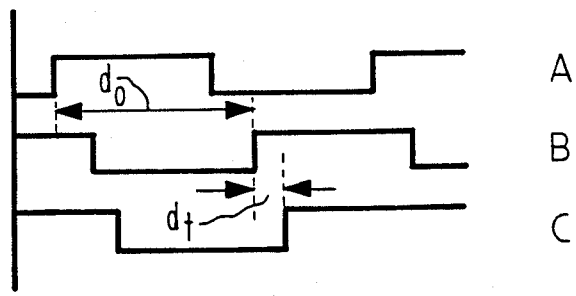
FIG. 7 comprises timing graphs illustrating the operation of FIG. 6.

FIG. 5 illustrates typical graphs for the main clock C, the delayed clock $C_d$, the output clock C, the phase comparator output 26c and other pertinent outputs in the embodiment of FIG. 4 during a typical example of automatic clock delay adjustment. For greater clarity, the waveforms shown in FIG. 5 as well as those shown in FIGS. 3A, 3B and 7 are illustrated in idealized form.

As illustrated in FIG. 4, the phase comparator output 26c (Graph D in FIG. 5) is applied to an OR gate 110 via a string of two flip-flops 111 which provide a two-clock delayed phase comparator signal 26d (Graph E). The use of this string of flip-flops 111 is advantageous in that it reduces meta-stability problems in the logic following thereafter. If at the rise of the clock $C_s$ (Graph C) the delayed clock $C_d$ (Graph B) is low because the delay of $C_s$ relative to the main clock C does not equal that of $C_d$ as indicated by $d_1$ in Graph C (see also FIG. 3A), then the phase comparator output 26c (Graph D) will also be low. Since this phase comparator output signal 26c is applied to the string comprised of the two flip-flops 111, the delayed phase comparator output signal 26d (Graph E) will correspond to that of the phase comparator output signal 26c two clock periods earlier.

As shown in FIG. 4, the delayed phase comparator output signal 26d (Graph E) is applied to an input of an OR gate 110, while a lock flip-flop 112 applies a lock signal 112a (which is initially set to a low value) to another input of the OR gate 110. The OR gate 110 has two outputs, an OR output 110a and an inverse OR output 10b. Thus, when the phase comparator output signal 26c (Graph D) is low, the OR output 110a will be low while the inverse OR output 110b will be high, and vice versa, when the phase comparator output signal 26c is high.

Still with reference to FIG. 4, th-e inverse OR output 110b is applied to an input of an AND gate 114 while the OR output 110a is applied to an input of an AND gate 116. Applied to two other inputs of each of the AND gates 114 and 116 are the outputs 117a and 117b of a 2-bit counter 117 whose four counts (0, 1, 2 and 3) are illustrated in Graph F of FIG. 5. It wi-11 be understood that the logic performed by OR gate 110 and AND gates 114 and 116 in conjunction with the 2-bit counter 117 is such that, each time the count of the 2-bit counter 117 reaches 3, the AND gates 114 and 116 will be enabled since at the count of 3 both counter outputs 117a and 117b will be high. Thus, each time the AND gates 114 and 116 are enabled (as a result of the counter 117 reaching the count of 3), the AND gate output 114a (Graph G) will correspond to the state of the inverse OR output 110b, which in turn corresponds to the inverse of the current state of the delayed phase comparator output signal 26d (Graph E), while the AND gate output 116a (Graph H) will correspond to the current state of the OR output 110a, which in turn corresponds to the state of the lock signal 112a.

As will be understood from the example illustrated in FIG. 5, when the 2-bit counter 117 (Graph F) first reaches a count of 3 (causing AND gates 114 and 116 to be enabled), the delayed phase comparator output 26d (Graph E) will be low since the delay of the output clock $C_s$ (Graph C) is less than that of the delayed clock $C_d$ (as indicated by the delay difference $d_1$ in Graph C). As a result, the resulting high level appearing at the inverse OR output 110b will cause the AND output 114a (Graph G) to become high during count 3 of the two-bit counter 117 (Graph F), which in turn will cause the delay line counter 18 (Graph H) to advance from its initial count 0 to count 1, causing the multiplexor 14 to select the next greater delay line tap 12a. This increases the delay of $C_s$ such that a reduced delay difference $d_2$ (Graph C) is obtained between $C_s$ and $C_d$. Since the OR output 110a will be low during count 3 of the 2-bit counter 117, the AND gate output 116a (Graph I) will also be false so that, when applied via an OR gate 120 to the data input D of the lock flip-flop 112, the lock flip-flop output 112a (Graph I in FIG. 5) will remain low.

When the two-bit counter 117 (Graph F in FIG. 5) reaches count 3 for the second time, the delayed phase comparator output (Graph E) will still be low because of the remaining delay difference $d_2$ (Graph C) between $C_s$ and $C_d$. Thus, as described for the previous arrival of the 2-bit counter 117 at count 3 (Graph F), the AND output 114a will again become high to now advance the delay line counter 18 (Graph H) to count 2 while the lock flip-flop output 112a again remains low.

For the particular example illustrated in FIG. 5, it is assumed that the advance of the delay line counter 18 to its second count causes the delay of $C_s$ to be increased so that the delay of $C_s$ relative to the main clock C (Graph A) is substantially equal to the delay of $C_d$ relative to C, as indicated by the $d_3=0$ designation in Graph C of FIG. 5. As a result of having achieved this match between $C_s$ and $C_d$, the phase comparator output 26a now becomes high, as shown in Graph D of FIG. 5, which in turn causes the delayed phase comparator output 26d (Graph E) to become high two clock periods later, which period corresponds to the third arrival of the 2-bit counter 117 at count 3 (Graph F). Thus, during this third occurrence of count 3 of the two-bit counter 117, the AND output 114a (Graph G) will now be low while the AND output 116a (Graph H) will become high (Graph I) and pass via OR gate 120 to the input of the lock flip-flop 112 so as to also set the lock signal 112a high as shown in Graph J.

It will be understood that when the lock signal 112a becomes high as just described, it will be locked in this high setting because the lock signal 112a is fed back via OR gate 120 to the data input of the lock flip-flop 112. It will also be understood that since the lock signal 112a is also applied to OR gate 110, this locked in high level of the lock signal 112a will thereafter cause a low level output to be applied to AND gate 114 to prevent its being enabled. Thus, any further advancement of the delay line counter 18 is prevented, thereby locking in the desired matched relationship between $C_d$ and $C_s$. It will be noted in this regard that the 2-bit counter 117 is advantageous in that it provides for alternating between detecting the phase difference between $C_d$ and $C_s$ and advancing the counter 18, thereby facilitating the locking in of the desired matched relationship between $C_s$ and $C_d$.

Figure 6:
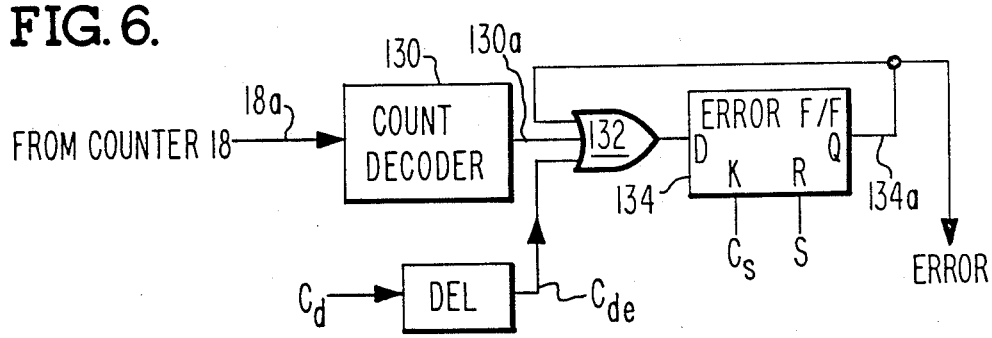
FIG. 6 is an electrical block diagram illustrating how error checking may additionally be provided for the implementation of FIG. 4.

FIG. 6 illustrates how error checking may additionally be provided for the implementation of FIG. 4. Two types of error checking are illustrated in FIG. 6. First, a counter decoder 130 is provided to which the count of the delay line counter 18 in FIG. 2 is applied. The decoder 130 is constructed and arranged in a conventional manner to provide a high output signal 130a via an OR gate 132 to the data input D of an error flip-flop 134. If the count of the delay line counter 18 advances beyond a predetermined maximum count (indicating that the delay required to be added to $C_s$ in order to match $C_d$ is greater than can be provided by the delay line 12), the decoder output 130a becomes high to set the error flip-flop 134 so as to thereby set the error flip-flop output 134a high, indicating an error.

A second type of error checking illustrated in FIG. 6 is provided by applying the delayed clock signal $C_d$ to the error flip-flop 134 (via the OR gate 132) to an error check delay circuit 136 which produces an additionally delayed clock signal $C_{de}$. Graphs A, B and C in FIG. 7 illustrate typical waveforms for C, $C_d$ and $C_{de}$, respectively. It will be understood that if, as illustrated by d+ in FIG. 7, the delay of $C_s$ relative to the main clock C is greater than $C_{de}$ (in which case no proper match can be obtained between $C_s$ and $C_d$), then the error flip-flop 134 will be set (since both $C_s$ and $C_{de}$ will be high) to set the error flip-flop output 134a high to indicate an error. Once set, the error flip-flop 134 remains set since the error flip-flop output 134a is fed back via OR gate 132 to the data input D of the error flip-flop 134.

As was pointed out previously, the accurate reference delay (FIGS. 2 and 4) is an important element of the automatic clock de-skewing circuitry provided on the clock distribution chip 5a. In a typical state of the art data processing system, the reference delay 24 might be required to provide an accurate delay of, for example, six nanoseconds. Such a delay with the required accuracy would be most difficult and expensive to provide either on a chip or as a lumped delay. In accordance with the present invention, this accurate delay line 24 is advantageously provided as a strip line conductor formed from an edge of an inner plane of a conventional type of multi-layer circuit board employed for each of the boards 2 (FIG. 1).

Figure 8:
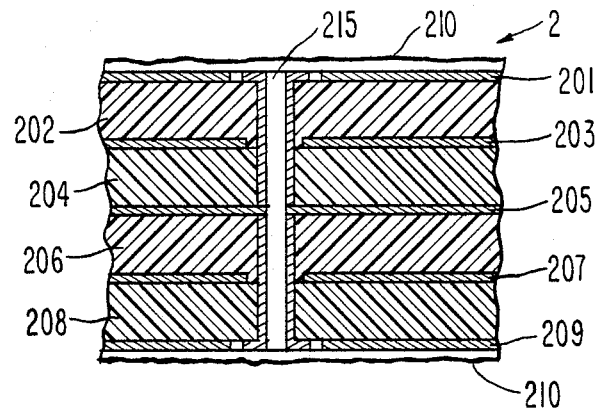
FIG. 8 is a diagrammatic cross-sectional representation of a multi-layer board construction which may be employed in the described embodiment.

A multi-layer board construction which may be employed for each board 2 in FIG. 1 is schematically illustrated in FIG. 8. As shown in FIG. 8, this board comprises conductive planes 201, 203, 205, 207 and 209 separated by insulating dielectric layers 202, 204, 206 and 208 with multiwire magnet wiring 210 being provided adjacent the top and bottom conductive planes 201 and 207. Typically, integrated circuit chips (such as illustrated by 5 and 5a in FIG. 1) are mounted adjacent the top plane 201. Conductive planes 201, 205 and 209 may, for example, serve as ground planes and conductive planes 203 and 207 may serve as voltage planes. Also, plated-through holes, such as indicated at 215, are provided in a conventional manner passing through the board structure for making desired connections between the conductive planes and the magnet wiring 210 and integrated circuit chips. As is also conventional, flow soldering techniques may be used adjacent surface 209 to electrically connect the plated-through holes 215 in a desired pattern. Various types of multi-layer circuit board constructions which may also be employed in accordance with the invention will be evident from U.S. Pat. Nos. 4,047,132 and 4,560,962 and the references identified therein.

Figure 9:
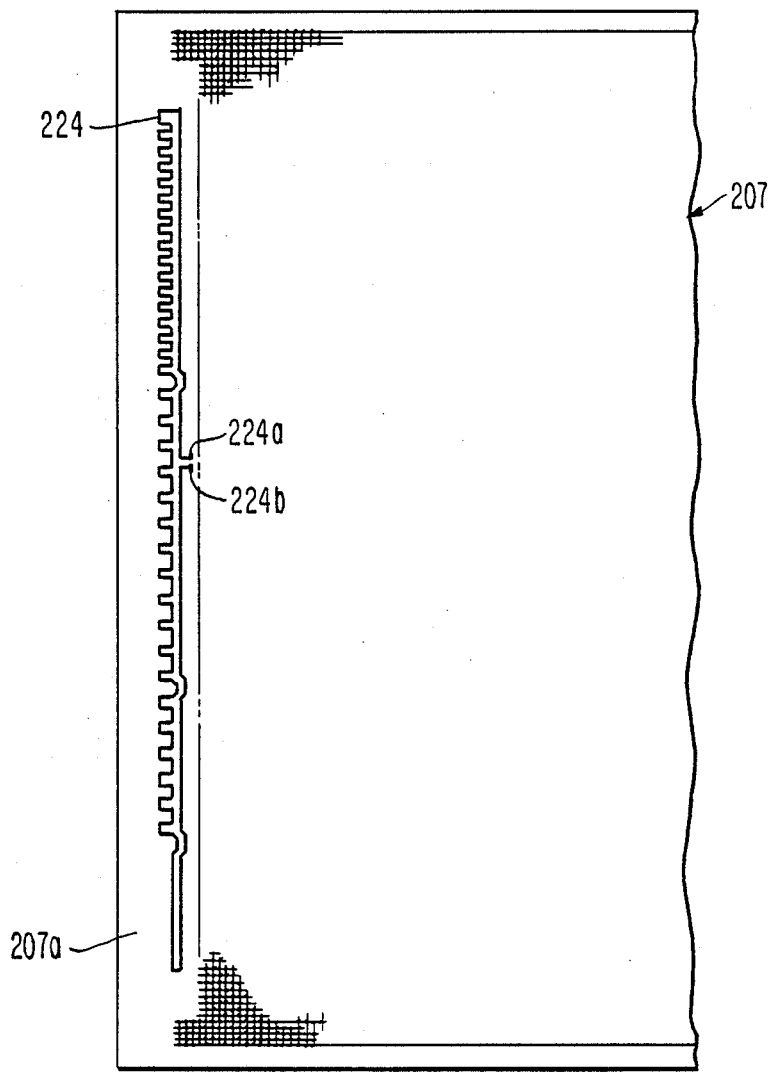
FIG. 9 is a plane view of a conductive plane of the multi-layer board construction illustrated in FIG. 8 illustrating how a precise delay line can be provided therein.

Reference is now directed to FIG. 9 which illustrates how the reference delay 24 (FIGS. 2 and 4) may be provided as a predetermined length conductive strip 224 serving as a transmission line and formed from an edge portion of conductive plane 207 of the multi-layer board structure illustrated in FIG. 8. Other ones of the conductive planes could also be employed. An internal conductive plane is preferred since it facilitates maintaining a desired impedance, and also because the propagation delay provided thereby is primarily determined by the length of the strip 224.

In a particular preferred embodiment, a length of 26 to 30 inches is chosen for the strip 224, which provides a delay of about 6 nanoseconds. The cross-sectional thickness is typically 3 mils and the strip width is typically 8–10 mils. The particular path followed by the strip 224 is chosen to provide the desired length, and also so as to pass around any holes which may be provided for other purposes in the multi-layer board structure. The ends of the strip 224 are formed as pads 224a and 224b. These pads 224 and 224b are connected to plated-through holes that extend to the top of the board and receive respective ones of the terminals of the clock distribution chip 5a (FIG. 1) so as to provide the electrical connections between the automatic de-skewing circuitry and the reference delay 24 illustrated in FIGS. 2 and 4. It will be understood that, since the length of the strip 224 can be very accurately controlled with known strip forming techniques, a very accurate propagation delay can be provided for the automatic de-skewing circuitry.

The strip 224 shown in FIG. 9 may be formed by selectively etching the edge portion 207a of the plane 207 such that only the conductive strip 224 remains, as shown. Preferably, the clock distribution chip 5a (FIG.

1) is mounted above this edge portion 207a so that electrical connections can readily be provided between the strip pads 224a and 224b and their respective terminals of the clock distribution chip 5a using plated-through holes. The remaining portion of plane 207 shown in FIG. 9 is conventional.

Although the present invention has been described with reference to particular preferred embodiments, it is to be understood that various modifications in construction, arrangement and use are possible without departing from the true scope and spirit of the present invention. For example, the invention disclosed herein is also applicable for use with other types of wiring and/or board constructions as well as being usable for deskewing or controlling the delay provided between other types of signals besides clock signals. Accordingly, the present invention is to be considered as encompassing all possible modifications and variations coming within the scope of the appended claims.

What is claimed is:

1. A method for automatically providing de-skewed clocks for a data processing system including a plurality of circuit boards constructed and arranged to receive integrated circuit chips, said method comprising the steps of:
   applying an input clock to each board;
   on each board, distributing de-skewed clocks to other chips on the board by performing automatic clock de-skewing in response to said input clock using an accurate reference delay to determine the amount of de-skewing required; and
   providing said accurate reference delay for each board by forming a transmission line therein.

2. The invention in accordance with claim 1, wherein each board is of multi-layer construction including at least one internal conductive layer, and wherein said transmission line is formed in said conductive layer.

3. The invention in accordance with claim 2, wherein said transmission line is a strip transmission line having a length greater than 10 inches.

4. The invention in accordance with claim 2, wherein said automatic clock de-skewing is performed by an integrated circuit chip mounted to said board and electrically coupled to said transmission line.

5. The invention in accordance with claim 4, including forming said transmission line along an edge of said internal conductive layer, locating said clock chip above said edge, and electrically connecting said transmission line and said clock chip by plated-through holes formed in said board.

6. The invention in accordance with claim 1, 2, 3, 4 or 5, wherein said automatic clock de-skewing comprises the steps of:
   producing in response to said input signal a plurality of delayed signals having different delays relative to said input signal;
   selecting one of said delayed signals for producing an output clock;
   comparing the time relationship between a first signal derived from said output clock and a second signal derived from said input clock for determining, based on the delay provided by said transmission line, whether the delay provided by a selected delayed signal is substantially equal to a desired predetermined delay;
   automatically selecting a different delayed signal if the delay provided by a currently selected delayed signal is determined not to be substantially equal to said desired delay;
   repeating the steps of comparing and automatically selecting until a currently selected delayed signal is determined to provide substantially said desired delay; and
   preventing selection of a different delayed signal when the currently selected delayed signal is determined to provide a delay which is substantially equal to said desired delay.

7. The invention in accordance with claim 6, wherein the step of preventing includes locking-in selection of a selected input signal when it is determined to provide a delay which is substantially equal to said desired delay.

8. The invention in accordance with claim 7, wherein said second signal is derived by passing said input clock through said transmission line.

9. The invention in accordance with claim 6, wherein the step of automatically selecting includes changing the count of a counter in response to the step of comparing determining that the currently selected delayed signal does not provide said desired delay and selecting another delayed signal for application to said circuit dependent upon the count of said counter.

10. The invention in accordance with claim 9, wherein said changing occurs in a manner so that each change of count increases the delay provided by the selected delayed signal.

11. The invention in accordance with claim 10, including the step of setting said counter to an initial count prior to application of a selected input signal to said circuit.

* * * * *

UNITED STATES PATENT AND TRADEMARK OFFICE
CERTIFICATE OF CORRECTION

PATENT NO. : 4,754,164

DATED : June 28, 1988

INVENTOR(S) : LAURENCE P. FLORA et al.

It is certified that error appears in the above-identified patent and that said Letters Patent is hereby corrected as shown below:

Col. 6, line  9, "10b." should be --110b.--.

Col. 6, line 14, "th-e" should be --the--.

Col. 6, line 20, "wi-11" should be --will--.

Signed and Sealed this

First Day of November, 1988

Attest:

DONALD J. QUIGG

*Attesting Officer*    *Commissioner of Patents and Trademarks*